(12) United States Patent
Poplevine et al.

(10) Patent No.: US 7,286,383 B1
(45) Date of Patent: Oct. 23, 2007

(54) BIT LINE SHARING AND WORD LINE LOAD REDUCTION FOR LOW AC POWER SRAM ARCHITECTURE

(75) Inventors: Pavel Poplevine, Foster City, CA (US); Annie-Li-Koow Lum, Milpitas, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/215,676

(22) Filed: Aug. 10, 2002

(51) Int. Cl.
*G11C 5/06* (2006.01)
*G11C 7/00* (2006.01)
(52) U.S. Cl. .................... 365/63; 365/189.08; 365/203
(58) Field of Classification Search .................. 365/49, 365/154, 156, 203, 233, 205, 207, 208, 63; 257/367
See application file for complete search history.

(56) References Cited

U.S. PATENT DOCUMENTS

| | | | | |
|---|---|---|---|---|
| 4,856,106 A * | 8/1989 | Teraoka | ....................... | 365/203 |
| 5,276,650 A * | 1/1994 | Kubota | ........................ | 365/207 |
| 5,428,574 A * | 6/1995 | Kuo et al. | .................. | 365/203 |
| 5,554,874 A * | 9/1996 | Doluca | ........................ | 365/154 |
| 5,621,693 A * | 4/1997 | Nakase | ........................ | 365/203 |
| 5,654,914 A * | 8/1997 | Nii et al. | .................... | 365/154 |
| 5,689,471 A * | 11/1997 | Voss et al. | .................. | 365/156 |
| 5,875,131 A * | 2/1999 | Shyu | .......................... | 365/203 |
| 5,963,493 A * | 10/1999 | Merritt et al. | ............. | 365/203 |
| 5,966,320 A * | 10/1999 | Hsu | ........................... | 365/156 |
| 6,130,846 A * | 10/2000 | Hori et al. | .................. | 365/203 |
| 6,288,969 B1 * | 9/2001 | Gibbins et al. | ............. | 365/154 |
| 6,298,005 B1 * | 10/2001 | Landry | ........................ | 365/233 |
| 6,356,473 B1 * | 3/2002 | Shimoyama | ................ | 365/49 |
| 6,563,730 B1 * | 5/2003 | Poplevine et al. | .......... | 365/154 |
| 6,570,227 B2 * | 5/2003 | Rockett | ...................... | 257/367 |
| 6,711,051 B1 * | 3/2004 | Poplevine et al. | .......... | 365/154 |

* cited by examiner

*Primary Examiner*—Trong Phan
(74) *Attorney, Agent, or Firm*—Jurgen Vollrath

(57) ABSTRACT

In a SRAM structure, space and power saving is achieved by providing row and column select lines to select a specific bit cell, and reducing the number of bit lines in the structure used for writing to and reading from the bit cells. The number of bit lines is reduced by sharing bit lines of adjacent bit cells. Furthermore, in order to achieve power saving, the load on the row select lines is reduced by sharing the pass gates between adjacent bit cells that are used to control precharging, reading from and writing to the bit cells.

3 Claims, 9 Drawing Sheets

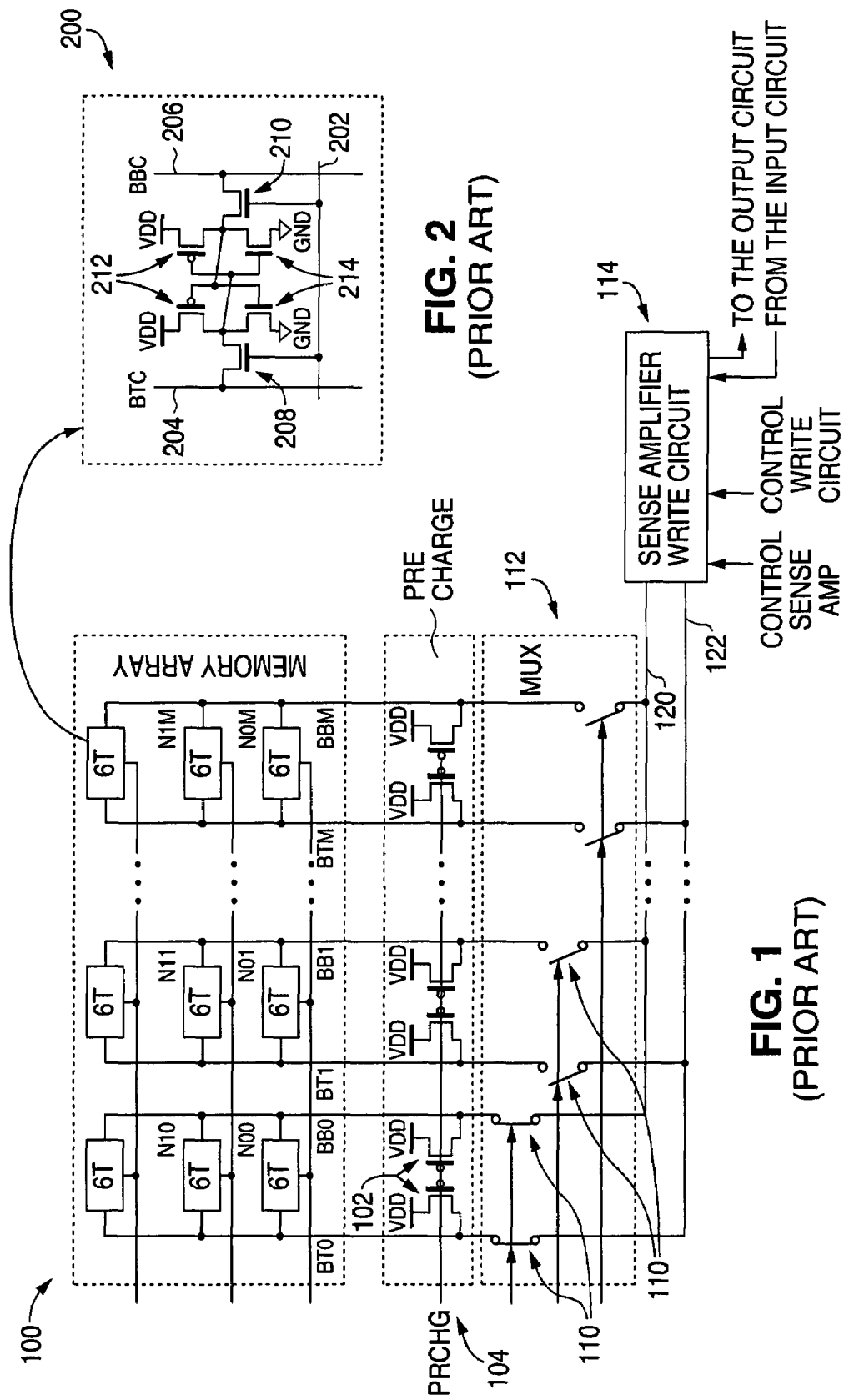

BIT LINE SHARING AND WORD LINE LOAD REDUCTION FOR LOW AC POWER SRAM ARCHITECTURE

FIELD OF THE INVENTION

The invention relates to semiconductor memories and in particular to Static Random Access Memory (SRAM), with a view to achieving space and power saving.

BACKGROUND OF THE INVENTION

Random Access Memory (RAM) retains information by maintaining a differential charge across a pairs of bit lines for each memory cell. One prior art RAM structure is shown in FIG. 1. FIG. 1 shows a structure 100 of 6 transistor (6T) bit cells or memory cells 200, each memory cell of which is shown in greater detail in FIG. 2. The 6T cell 200 includes a word line 202 and a pair of bit lines 204, 206. The word line 202 controls pass gates 208, 210 to allow discharging of the bit lines. The memory cell 200 is programmed or written to by applying a differential voltage across its bit lines, and is read by detecting a differential discharge across the bit lines. Each memory cell 200 includes a storage cell made up of four transistors: PMOS load transistors 212 and cross-couple NMOS storage transistors 214. The cell is operable in any one of three modes: static mode, write mode, and read mode.

During static mode, charge is maintained on the bit cells by keeping the word line 202 at logic zero (Ground) while precharging the bit lines 204, 206 to VDD.

In write mode, a logic 1 or 0 is programmed into the memory cell 200 by driving the word line 202 to a logic 1 and applying a differential voltage across the bit lines 204, 206 (logic 1 on bit line 204, and logic 0 on bit line 206 programs the cell 200 to a logic 1, and vice versa).

During read mode, a differential voltage is detected across the bit lines by driving the word line 202 to logic 1 and allowing the bit lines to discharge. The logic state of the bit cell 200 determines the nature of the discharge. For instance, if the cell was programmed to logic 1 (bit line 206 driven to logic 1 and bit line 204 driven to logic 0) then bit line 204 would discharge and bit line 206 would remain at VDD since before each read or write, every bit lines is precharged to VDD. Thus, if the logic state of the bit cell is 1, bit line 204 will be maintained at VDD.

Referring to FIG. 1, during static mode all memory cells are precharged to logic 1 by PMOS transistors 102. By applying a low voltage to the gates of the PMOS transistors 102 by means of PRCHG input 104, VDD is applied to the bit lines of the various cells in the structure. During this mode, the word lines are kept low to avoid discharging of the bit lines. During a read or write mode, the precharge PMOS transistors 102 are switched off and one of the word lines is driven to logic 1. This results in all memory cells in that row to start discharging their bit lines, which results in a large active power AC power dissipation. In order to write to or read from a particular memory cell, one of the switches 110 in the multiplexer block 112 is selected. This selects one of the columns. Writing to a memory cell (also referred to as a bit cell) requires the use of a write circuit 114 to apply a differential voltage across the bit lines by providing a differential voltage across the lines 120, 122. During read mode the differential voltage across the bit lines is detected using a sense amplifier and routing this to the output circuit. In FIG. 1, the write circuit and sense amplifier are depicted as a single block 114, and in FIG. 4 by block 314" to the end of the sentence. Input and output signals (Control sense amp, Control write circuit, From the Input circuit, To the Output circuit) are shown to the blocks 114, 314.

It will be appreciated that during each read or write operation, an entire row of precharged memory cells is discharged, thereby consuming a lot of AC power. It is therefore desirable to reduce this power consumption. One such approach was described in prior U.S. patent application owned by the same assignee and entitled "Low Power SRAM Architecture". This solution made use of 8 transistor (8T) memory cells 300 as shown in FIG. 3, in which two extra pass gates 302 were provided and controlled by an additional control line 310. As shown in the memory structure of FIG. 4, each of the control lines 310 controls a column of memory cells 300, while the word lines still control rows of memory cells. Thus the control lines 310, in conjunction with the word lines 312, allow a single memory cell 300 to be selected during the read or write operation and thereby cause only a single memory cell to discharge.

The loading on an active wordline depends on the total number of bit cells in a row. Furthermore, a typical 6T bit cell has 2 wordline pass gates, therefore the load is big.

The present invention seeks to reduce the load on the word line while also achieving a space saving.

SUMMARY OF THE INVENTION

The present invention provides a method and structure for saving space and reducing power consumption in Random Access Memory (RAM) during read and write operations by sharing bit lines and pass gates between adjacent memory cells.

According to the invention, there is provided a memory structure comprising a plurality of memory cells wherein each memory cell is individually selectable, a plurality of row select lines, a plurality of column select lines, and a pair of bit lines for each memory cell, wherein adjacent memory cells share a bit line. Typically the structure includes logic such as pass gates to allow the row select lines to select a particular row of memory cells. Preferably adjacent memory cells in a row share pass gates to reduce the load on the row select lines, which are typically word lines. The structure may be a synchronous or an asynchronous structure. In the case of a synchronous structure, the structure may include logic to control precharging of a shared bit line by two adjacent column select lines. For instance, adjacent column select lines can be ORed to control a pre-charge transistor that precharges a shared bit line.

Further, according to the invention, there is provided a SRAM structure, comprising a plurality of bit cells with bit lines for writing to and reading from the bit cells, wherein adjacent bit cells share bit lines. Each bit cell in the SRAM structure typically includes pass gates controlled by a row select line. However, it will be appreciated that instead of pass gates other types of control circuitry can be implemented to control access to the bit cells. Preferably, the pass gates are shared by adjacent bit cells to reduce the load on the row select lines.

Still further, according to the invention, there is provided a method of improving a SRAM structure, comprising sharing bit lines between adjacent bit cells to reduce the size of the structure. The method may further include sharing pass gates between adjacent bit cells for reading and writing to the bit cells.

BRIEF DESCRIPTION OF THE DRAWINGS

FIG. 1 is a schematic circuit diagram of a prior art RAM structure;

FIG. 2 is a schematic circuit diagram of a prior art memory cell;

DETAILED DESCRIPTION OF THE INVENTION

Figures 3, 4:
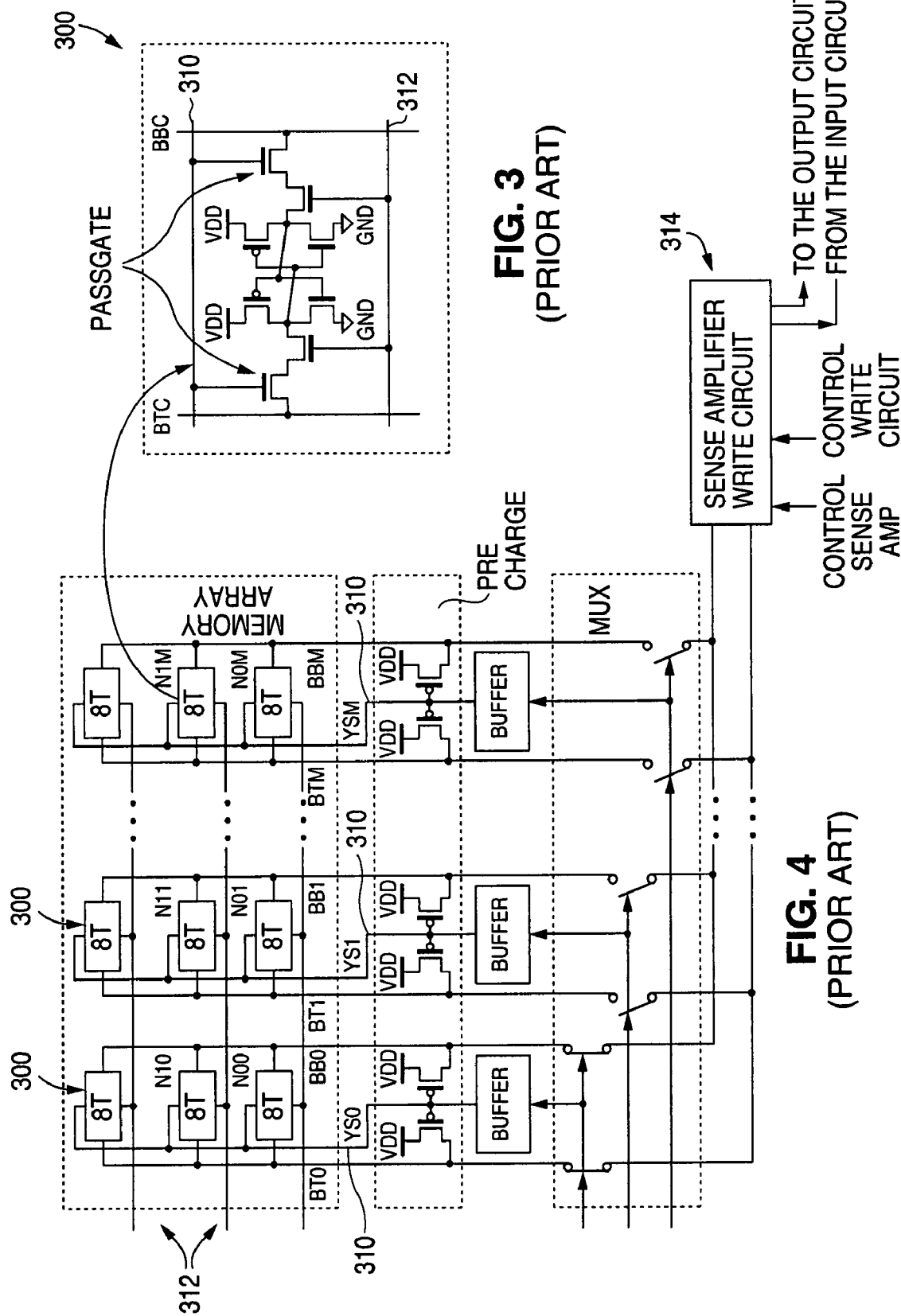
FIG. 3 is a schematic circuit diagram of another prior art memory cell.
FIG. 4 is a schematic circuit diagram of another prior art RAM structure.
Figure 5:
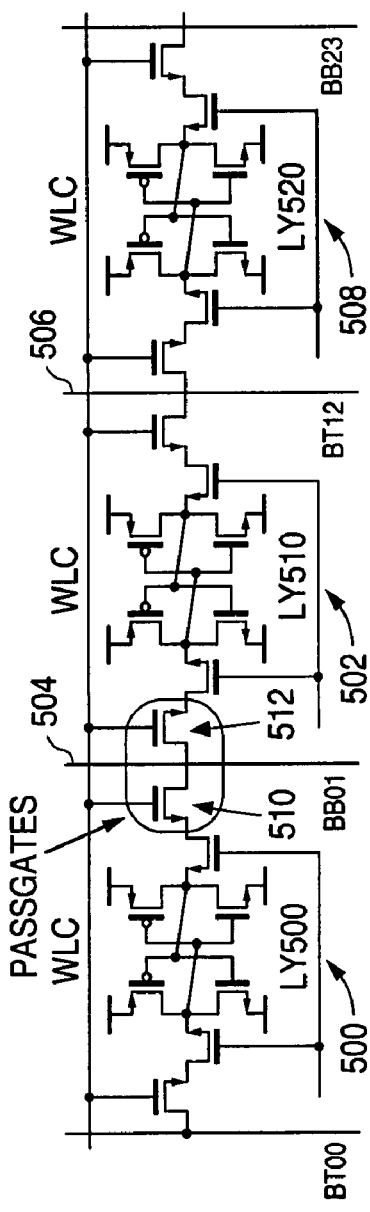
FIG. 5 is a schematic circuit diagram showing part of one embodiment of a RAM structure of the invention showing bit line sharing.

If one looks at a prior art SRAM structure such as the one shown in FIG. 1, it is seen that each column of memory cells has its own pair of bit lines. The present invention seeks to reduce the number of bit lines and thereby achieve a space saving, by sharing bit cells between the columns. This is illustrated for part of one row of 8 transistor (8T) memory cells in FIG. 5. Instead of two bit lines between the two memory cells 500, 502, a single bit line 504 is shared by the two memory cells. Similarly, bit line 506 is shared by memory cells 502 and 508. It will be appreciated that the order of the bit lines will now alternate. Thus, instead of having a BT bit line and a BB bit line for the first memory cell 500 (BT0, BB0 for column 0 in FIGS. 1 and 4), and a BT bit line and a BB bit line for the second memory cell 502 (BT1, BB1 for column 1 in FIGS. 1 and 4), one of the bit lines between them falls away (In FIGS. 1 and 4, BTM and BBM are used for the bit lines in the last column, and BTC and BBC for the bit lines in an intermediate column). In FIG. 5 the nomenclature adopted to depict this is to alternate BT and BB lines and indicate shared lines by means of numbers referring to the two memory cells sharing the bit line. Thus, for example, BB01 indicates that the first memory cell 500 (memory cell in column 0) and the second memory cell 502 (memory cell in column 1) share the bit line. Similarly there are bit lines BT00, BT12, BB23, to name but a few.

Figure 6:
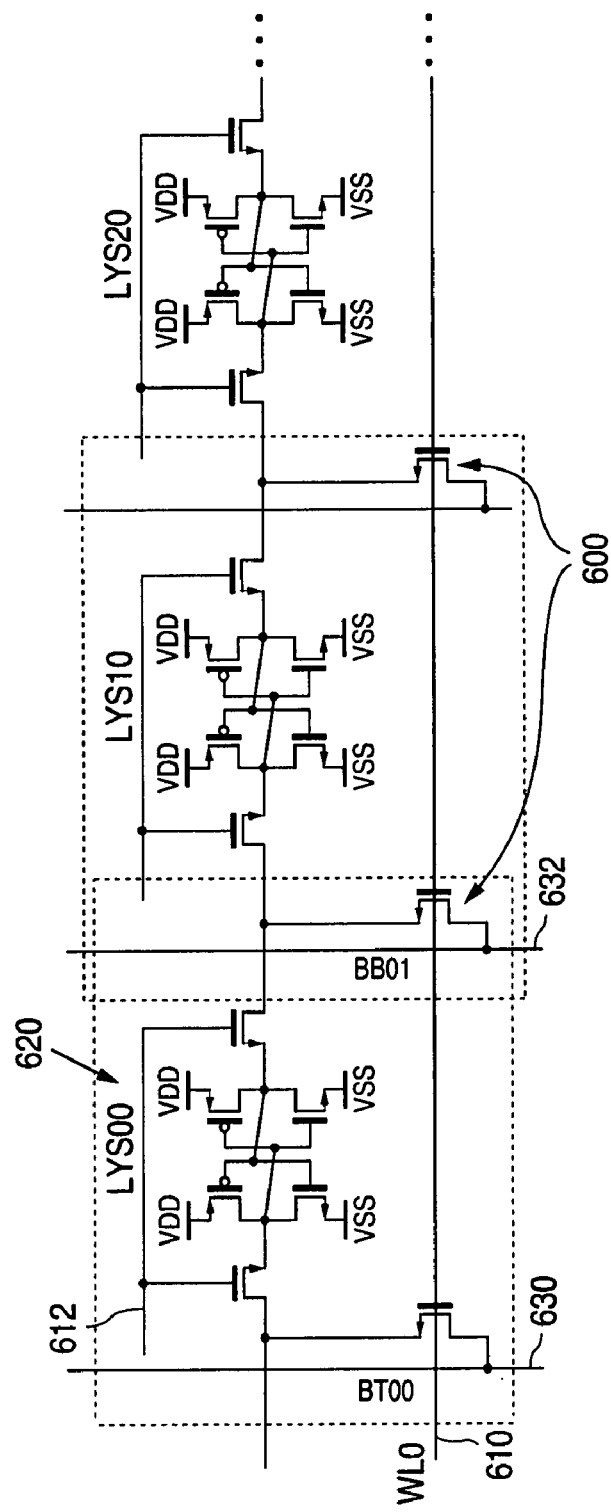
FIG. 6 is a schematic circuit diagram showing part of another embodiment of a RAM structure of the invention showing bit line and pass gate sharing.

While the above structure provides for a space saving by reducing the memory area, it does not reduce the active power consumption, since the total active load remains the same for each read/write operation. The present invention addresses this issue by sharing the adjacent pass gates 510, 512, as shown in FIG. 6 to provide for a shared pass gate 600 between each of the memory cells. This reduces the number of pass gates seen by the word to almost half the original number, thus significantly reducing the load on the word line. Since the word line capacitance is proportionately reduced, the AC power consumption is also reduced.

The functionality is not affected by this change in structure. For instance, when word line 610 (WL0) and column select line 612 (LYS00) are on or at logic 1, bit cell 620 is selected, and bit lines 630 (BT00) and 632 (BB01) will be sensed (LYS10 and LYS20 depict the column select lines for the next two columns, as shown both in FIG. 5 and FIG. 6).

It will be appreciated that the memory cells are now essentially 6 transistor (6T) memory cells with two shared NMOS pass gates.

Figure 7A:
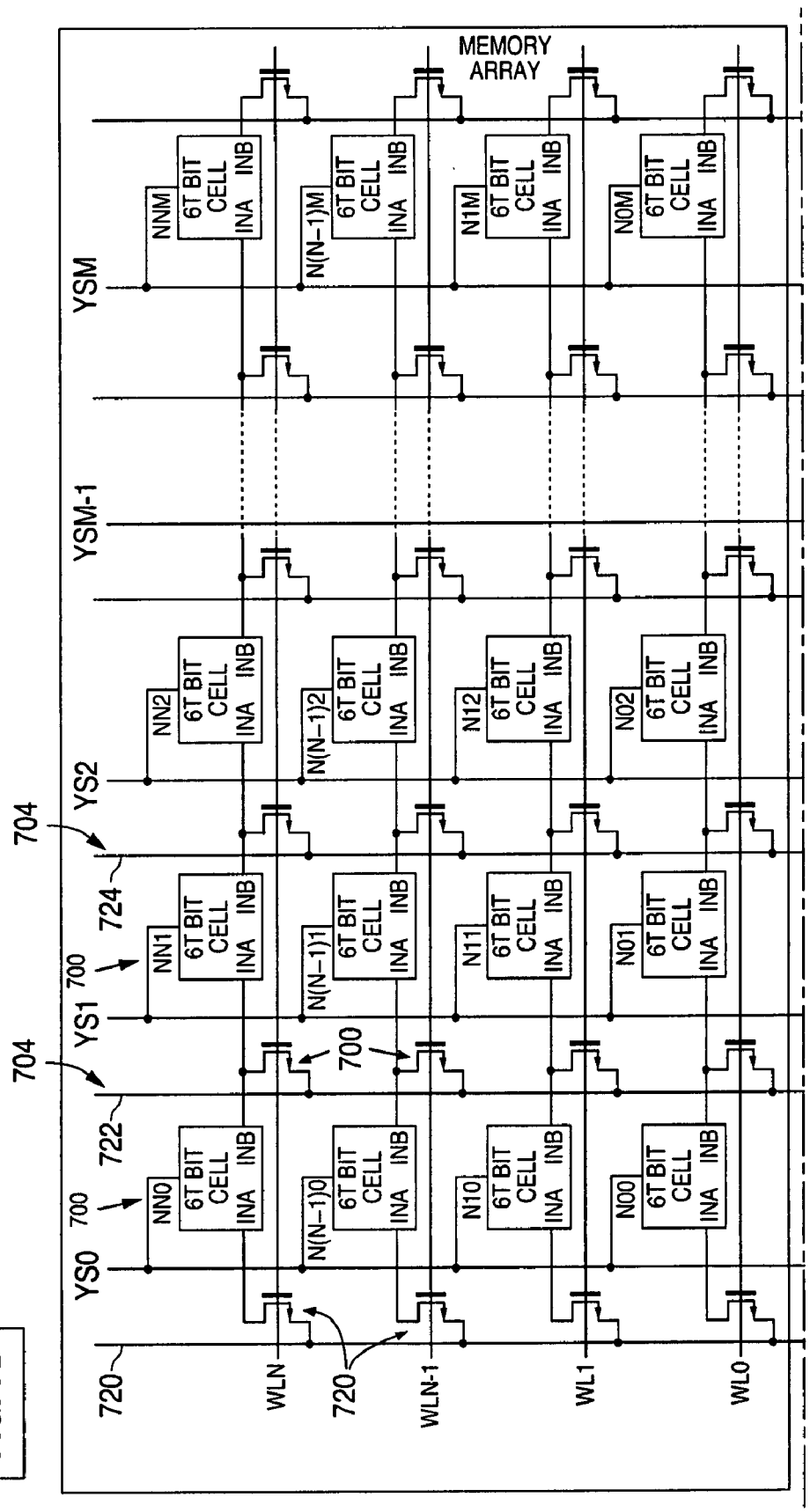
FIG. 7 is a schematic circuit diagram of one embodiment of a RAM structure of the invention showing bit line and pass gate sharing.
Figure 7B:
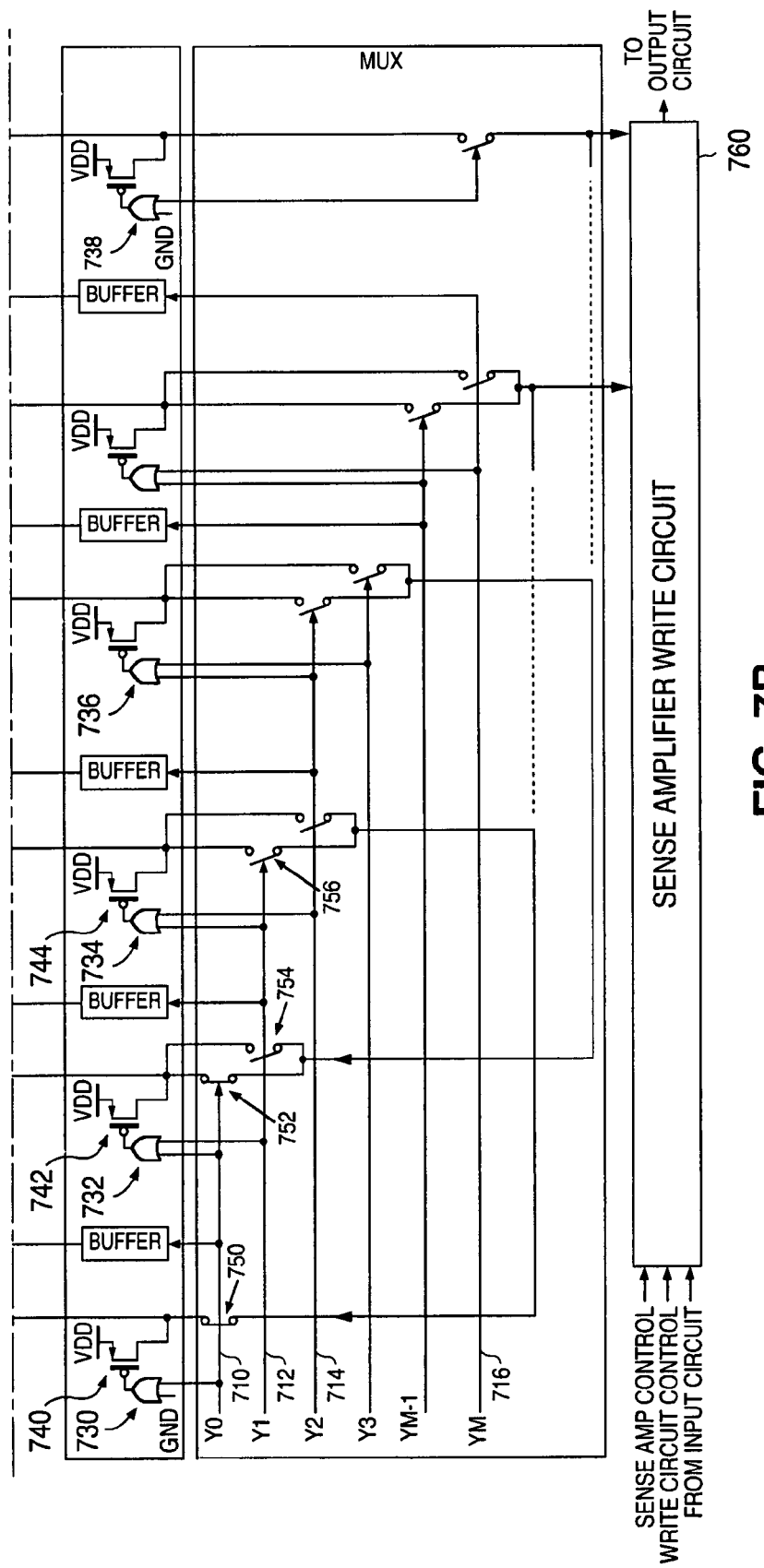

One embodiment of a synchronous application of the invention is shown in FIG. 7. The memory cells or bit cells 700 are shown as 6T bit cells with NMOS pass gates 702 that are shared between adjacent bit cells 700. Since bit lines 704 are share between bit cells 700, the precharge circuit is shared between columns. The precharge logic is controlled by adjacent column select lines 710, 712, 714, 716 (Y0, Y1 ... YM) which extend through buffers to column select lines YS0, YS1, YS2, respectively. As shown, the last column select line is defined as YSM and the one preceding YSM YSM-1. Similar nomenclature is used for FIGS. 8 and 9 embodiments. When a bit cell in the first column is to be read, precharging has to take place for bit lines 720 and 722. When a bit cell in the second column is to be read, precharging has to take place for bit lines 722 and 724. Thus, in both cases, share bit line 722 (BBOI) is precharged. In this embodiment the logic controlling this function takes the form of OR gates 730, 732, 734, 736 ... 738. When column select line 710 goes high for a read or write operation, one input to each of OR gates 730 and 732 goes high, thus switching off precharge transistors 740, 742. At the same time, column select line 710 closes switches 750, 752 to connect the bit lines 720, 722 to the sense amplifier write circuit 760. Similarly, when column select line 712 (Y1) goes high to write to or read from a memory cell in the second column, precharge transistors 742, 744 are switched off by the high going outputs of OR gates 732, 734, and bit lines 722, 724 are connected to the sense amplifier 760 by switches 754, 756 (As shown, the sense amplifier has inputs Sense Amp Control, Write Circuit Control, From Input Circuit, and output To Output Circuit.) Thus the functionality of the memory structure is not affected. However, both a space saving and a power saving is achieved by the configuration of the present invention.

Figure 8A:
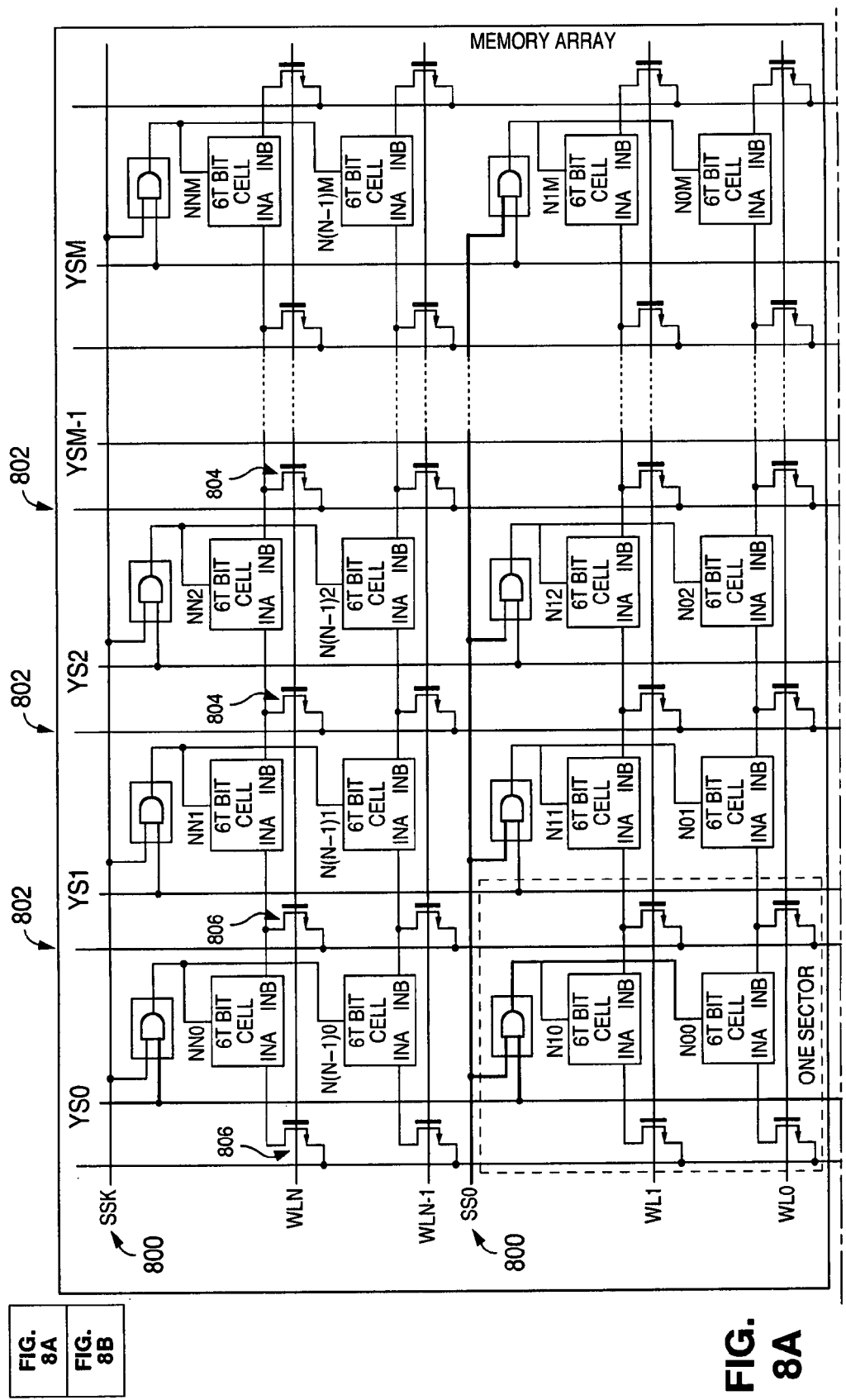
FIG. 8 is a schematic circuit diagram of another embodiment of a RAM structure of the invention showing bit line and pass gate sharing.
Figure 8B:
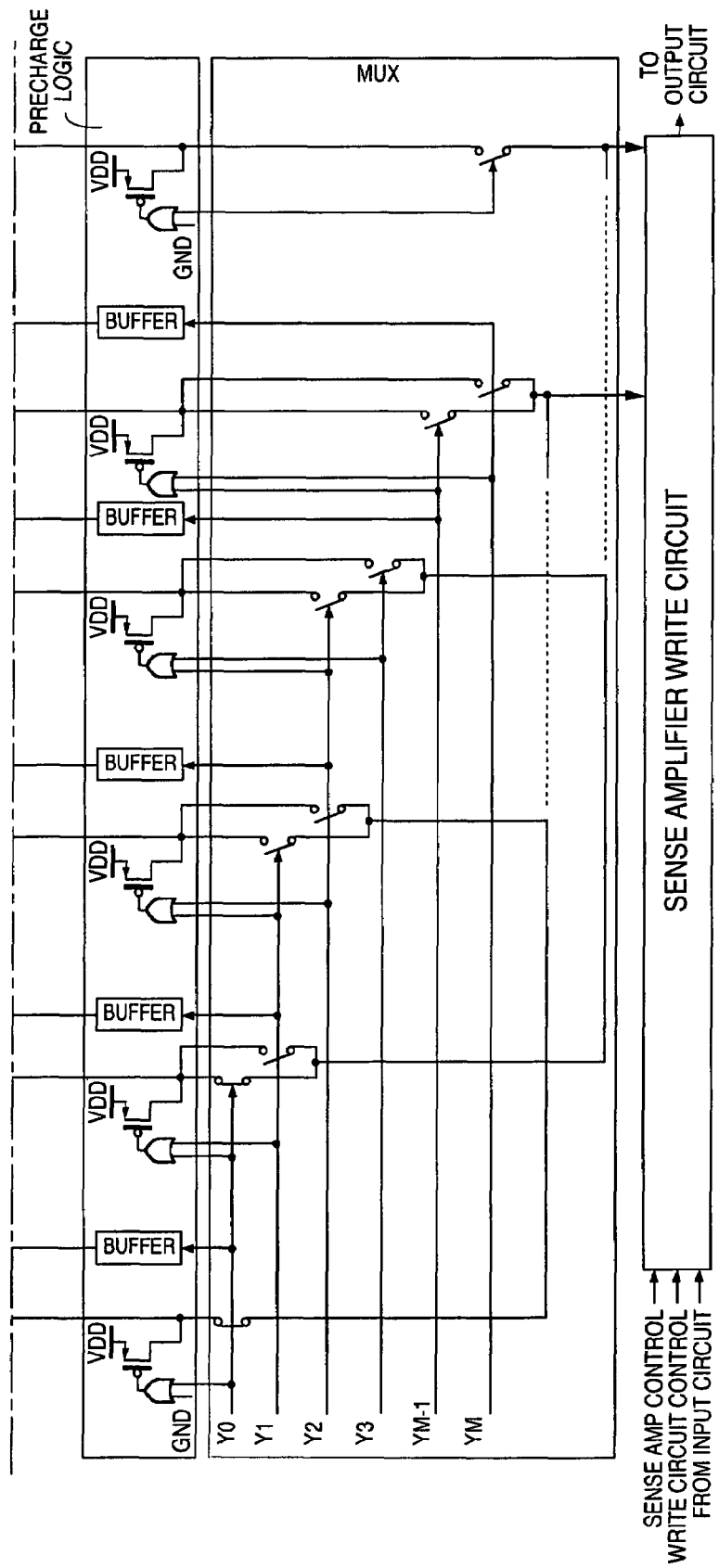

Another embodiment of a SRAM structure is described in concurrently filed application by the same applicants, entitled "LOW AC POWER SRAM ARCHITECTURE", the entire contents of which are incorporated herein by reference. This architecture makes use of sector select lines to define selectable sectors in the SRAM matrix. The concepts of the present invention are equally applicable to this structure, as shown in FIG. 8, which shown a SRAM matrix with sector select lines 800, and shared bit lines 802 and pass gates 804. The present invention, in this embodiment, operates in a similar manner as was discussed with reference to FIG. 7.

Figure 9A:
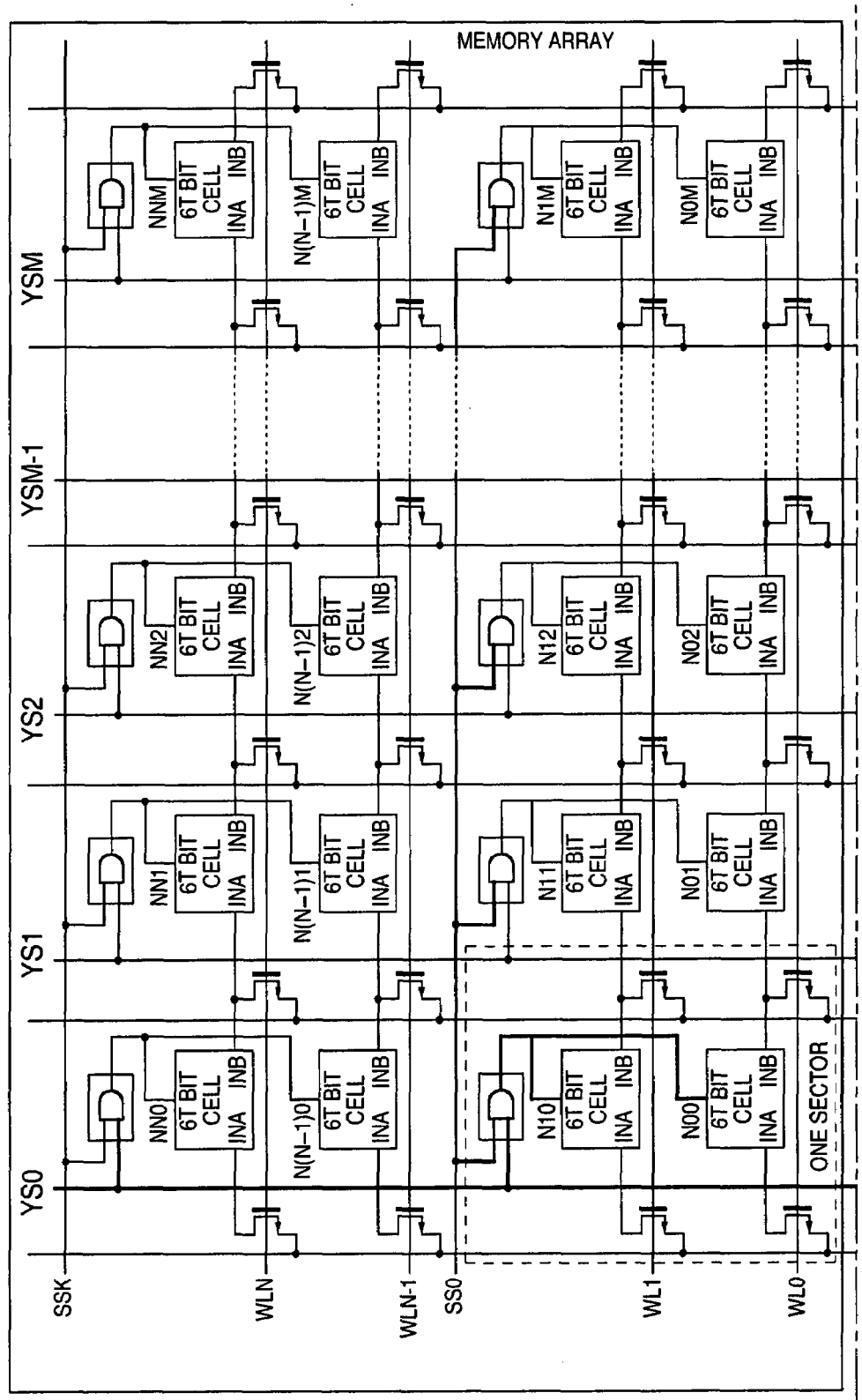
FIG. 9 is a schematic circuit diagram of yet another embodiment of a RAM structure of the invention showing bit line and pass gate sharing.
Figure 9B:
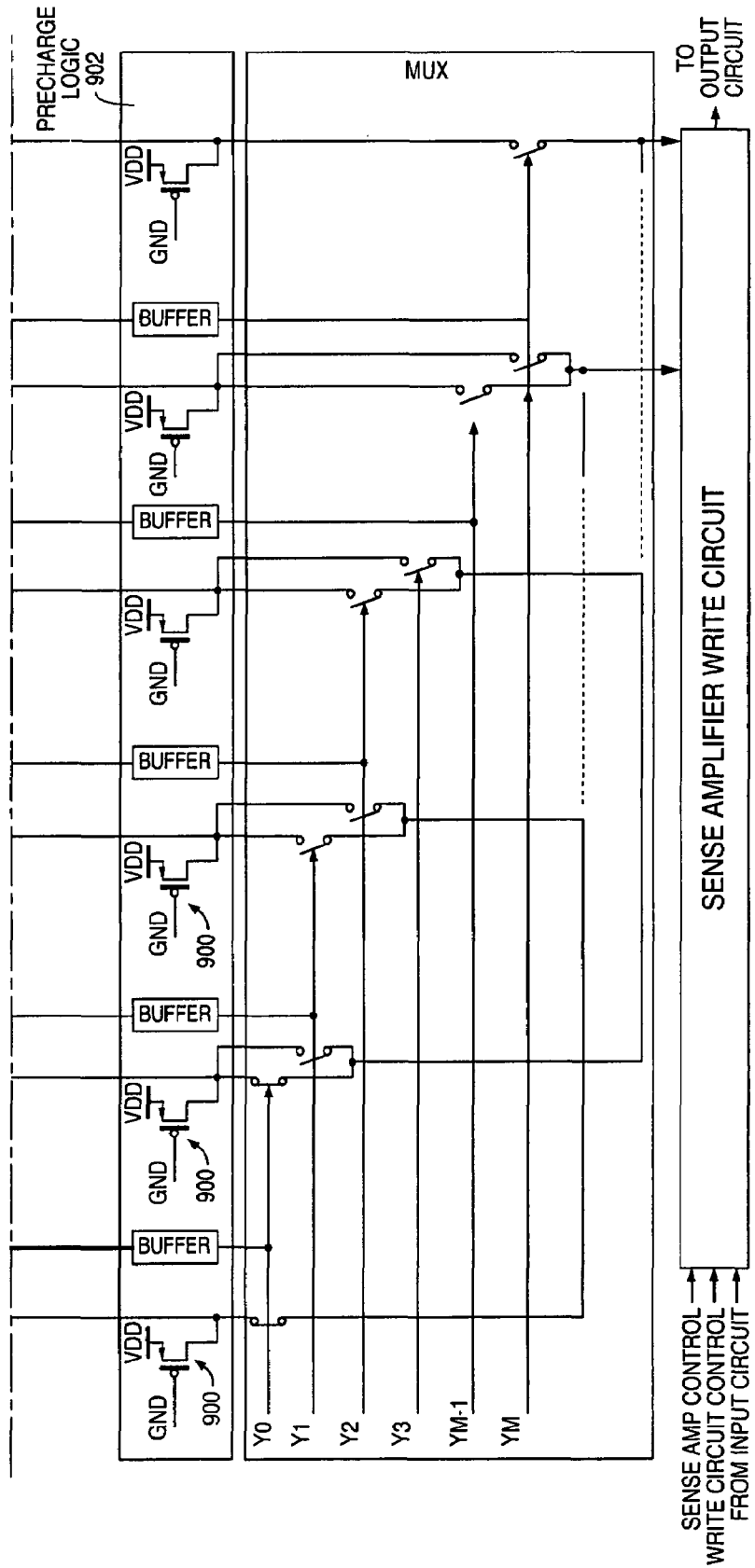

While FIGS. 7 and 8 showed synchronous SRAM circuits, the present invention is also implementable in an asynchronous SRAM circuit, as shown in FIG. 9. The asynchronous structure distinguishes itself only in that the precharging in asynchronous SRAM is not clocked and always stays at logic 1. To achieve this, the PMOS transistors 900 of the precharge block 902 have their gates permanently tied to ground instead of being controlled by signals from the column select lines. Thus the bit lines to the memory cells are permanently held high, allowing precharging to occur whenever the word lines are low. During a write operation a differential voltage is applied across the bit lines of the selected columns and one of the word lines goes high to select the appropriate cells. During the read operation the word line is held high to allow the bit lines to discharge, and the differential voltage is detected.

In both synchronous and asynchronous applications, the present invention thus achieves a significant space and power saving over the prior art by making use of bit line sharing and pass gate sharing. It will be appreciated that the SRAM structure could be implemented in different ways without departing from the scope of the invention as defined in the claims.

What is claimed is:

1. A memory structure, comprising
   a plurality of 6T memory cells each comprising two NMOS and two PMOS transistors with the drains of the NMOS transistors connected to the drains of the PMOS transistors, and further comprising two pass gates,
   a plurality of row select lines for selecting rows of memory cells in the structure, wherein the row select lines present a load,
   a plurality of column select lines, which together with the row select lines allow individual memory cells to be selected for precharging, and
   a pair of bit lines for each memory cell, wherein adjacent memory cells share a bit line to define a shared bit line, the selecting of memory cells comprising using logic that includes a first set of pass gates controlled by the row select lines and a second set of pass gates controlled by the column select lines, the load on the row select lines being reduced by sharing pass gates between adjacent memory cells in a row.

2. A memory structure of claim 1, wherein the row select lines are word lines.

3. A memory structure of claim 1, wherein the structure includes logic to control precharging of each shared bit line by means of signals from adjacent column select lines, each pair of adjacent column select lines being ORed to control a pre-charge transistor that precharges one of the shared bit lines.

* * * * *